US012581979B2

(12) United States Patent
Wu et al.

(10) Patent No.: US 12,581,979 B2
(45) Date of Patent: Mar. 17, 2026

(54) SUBSTRATE AND PREPARATION METHOD THEREOF, INTEGRATED PASSIVE DEVICE, AND ELECTRONIC APPARATUS

(71) Applicants: Beijing BOE Optoelectronics Technology Co., Ltd., Beijing (CN); BOE Technology Group Co., Ltd., Beijing (CN)

(72) Inventors: Yifan Wu, Beijing (CN); Yue Li, Beijing (CN); Yuelei Xiao, Beijing (CN); Kidong Han, Beijing (CN); Qichang An, Beijing (CN); Yulin Feng, Beijing (CN); Xue Cao, Beijing (CN); Wenbo Chang, Beijing (CN); Yi Zhou, Beijing (CN); Lihui Wang, Beijing (CN); Qiuxu Wei, Beijing (CN); Feng Qu, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 503 days.

(21) Appl. No.: 18/021,813

(22) PCT Filed: Mar. 31, 2022

(86) PCT No.: PCT/CN2022/084563
§ 371 (c)(1),
(2) Date: Feb. 17, 2023

(87) PCT Pub. No.: WO2023/184401
PCT Pub. Date: Oct. 5, 2023

(65) Prior Publication Data
US 2024/0266235 A1     Aug. 8, 2024

(51) Int. Cl.
*H01L 23/15*     (2006.01)
*H01L 21/285*     (2006.01)
(Continued)

(52) U.S. Cl.
CPC ........ *H01L 23/15* (2013.01); *H01L 21/28506* (2013.01); *H01L 21/486* (2013.01);
(Continued)

(58) Field of Classification Search
CPC . H01L 23/15; H01L 21/28506; H01L 21/486; H01L 21/6835; H01L 23/49838;
(Continued)

(56) References Cited

U.S. PATENT DOCUMENTS

| | | | | | |
|---|---|---|---|---|---|
| 5,231,751 | A | * | 8/1993 | Sachdev | ................ H05K 3/445 257/E23.173 |
| 6,400,172 | B1 | * | 6/2002 | Akram | .............. H01L 21/76898 257/E21.597 |

(Continued)

FOREIGN PATENT DOCUMENTS

| | | |
|---|---|---|
| CN | 106409758 A | 2/2017 |
| JP | 2016-46267 A | 4/2016 |

*Primary Examiner* — Vu A Vu
(74) *Attorney, Agent, or Firm* — Ling Wu; Stephen Yang; Ling and Yang Intellectual Property

(57) ABSTRACT

Provided are a substrate, a method for preparing the substrate, an integrated passive device, and an electronic apparatus. The method for preparing the substrate includes: providing a base substrate including at least one blind via, wherein the base substrate includes a first surface and a second surface disposed oppositely, a blind via extends from a first surface side to interior of the base substrate, and an aperture of the blind via gradually decreases in a direction from the first surface to the second surface; forming a connection electrode in the blind via; thinning the base substrate along a direction from the second surface to the
(Continued)

first surface, wherein the blind via on the thinned base substrate forms a via hole penetrating the base substrate.

11 Claims, 7 Drawing Sheets

(51) Int. Cl.
| | |
|---|---|
| *H01L 21/48* | (2006.01) |
| *H01L 21/683* | (2006.01) |
| *H01L 23/498* | (2006.01) |
| *H01L 23/64* | (2006.01) |

(52) U.S. Cl.
CPC .... *H01L 21/6835* (2013.01); *H01L 23/49838* (2013.01); *H01L 23/645* (2013.01); *H01L 2221/68345* (2013.01)

(58) Field of Classification Search
CPC ......... H01L 23/645; H01L 2221/68345; H01L 23/49827; H01L 23/48; H05K 3/42
USPC .......................................... 257/621
See application file for complete search history.

(56) References Cited

U.S. PATENT DOCUMENTS

| | | | | |
|---|---|---|---|---|
| 7,211,899 | B2 * | 5/2007 | Taniguchi | H05K 1/115 |
| | | | | 257/E23.009 |
| 7,217,890 | B2 * | 5/2007 | Suemasu | H05K 3/4038 |
| | | | | 257/E21.216 |
| 7,284,323 | B2 * | 10/2007 | Cheng | H05K 3/423 |
| | | | | 29/853 |
| 7,545,017 | B2 * | 6/2009 | Lee | H03H 9/1092 |
| | | | | 257/796 |
| 7,560,371 | B2 * | 7/2009 | Dando | H01L 21/76898 |
| | | | | 257/E23.067 |
| 7,786,390 | B2 * | 8/2010 | Ikeda | H05K 3/427 |
| | | | | 174/255 |
| 8,338,957 | B2 * | 12/2012 | Nilsson | H01L 23/481 |
| | | | | 257/E21.597 |
| 8,379,356 | B2 * | 2/2013 | Tang | H01L 23/62 |
| | | | | 361/91.1 |
| 8,431,833 | B2 * | 4/2013 | Kajihara | H05K 3/0032 |
| | | | | 174/265 |
| 8,586,465 | B2 * | 11/2013 | Liu | H01L 24/11 |
| | | | | 257/E21.705 |
| 8,925,192 | B2 * | 1/2015 | Noda | H05K 3/4602 |
| | | | | 156/150 |
| 9,042,113 | B2 * | 5/2015 | Kim | H05K 3/4038 |
| | | | | 361/767 |
| 9,049,808 | B2 * | 6/2015 | Takada | H01L 23/49822 |
| 9,420,708 | B2 * | 8/2016 | Hibino | H01L 23/49827 |
| 9,484,259 | B2 * | 11/2016 | Lin | H01L 23/49827 |
| 9,516,753 | B2 * | 12/2016 | Hara | H01L 23/49822 |
| 10,304,757 | B2 * | 5/2019 | Yoon | H01L 21/3065 |
| 11,452,212 | B2 * | 9/2022 | Tuominen | H05K 1/115 |
| 2004/0041260 | A1 | 3/2004 | Wood et al. | |
| 2005/0277293 | A1 | 12/2005 | Kim et al. | |
| 2007/0045779 | A1 | 3/2007 | Hiatt | |
| 2007/0045836 | A1 | 3/2007 | Kwon et al. | |
| 2008/0079121 | A1 | 4/2008 | Han | |
| 2008/0303163 | A1 | 12/2008 | Liu et al. | |
| 2012/0097319 | A1 * | 4/2012 | Maeda | H01L 23/49822 |
| | | | | 156/151 |
| 2014/0097013 | A1 | 4/2014 | Hara et al. | |
| 2023/0192535 | A1 * | 6/2023 | Ambrosius | B23K 26/362 |
| | | | | 65/31 |

* cited by examiner

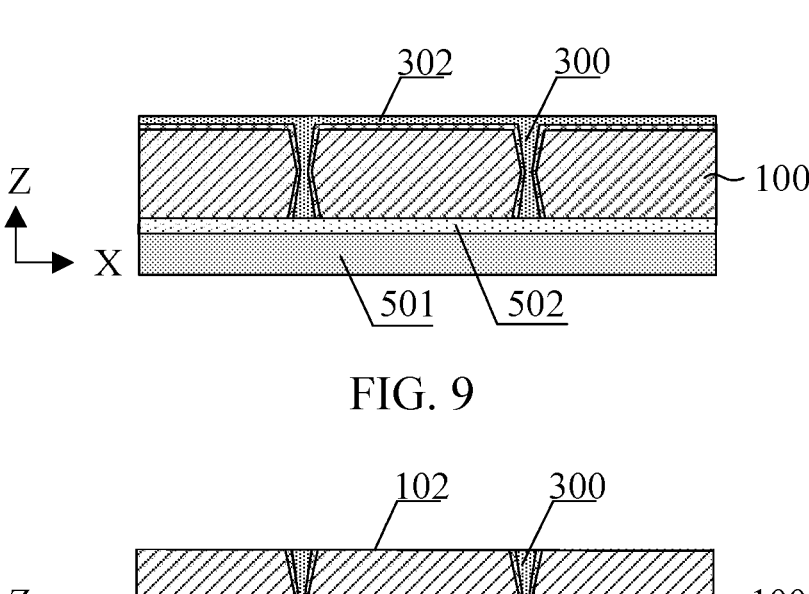
FIG. 9
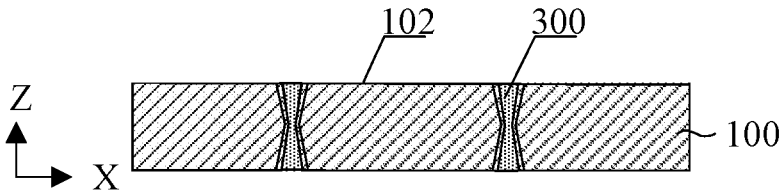
FIG. 10
FIG. 11
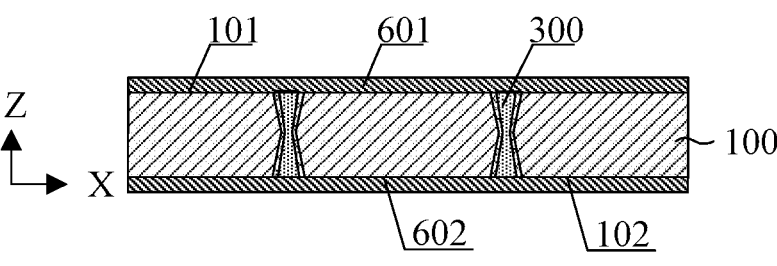
FIG. 12

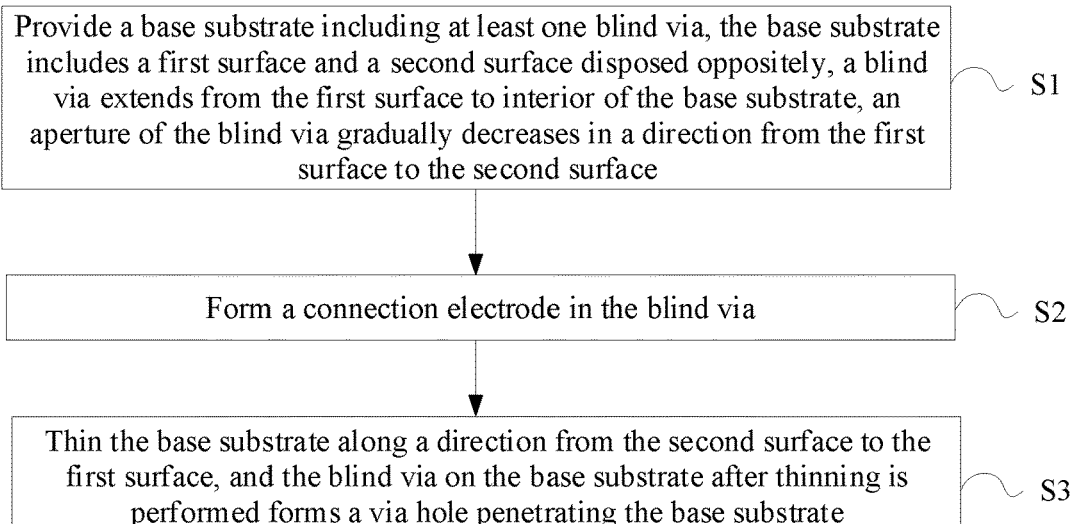

Provide a base substrate including at least one blind via, the base substrate includes a first surface and a second surface disposed oppositely, a blind via extends from the first surface to interior of the base substrate, an aperture of the blind via gradually decreases in a direction from the first surface to the second surface — S1

Form a connection electrode in the blind via — S2

Thin the base substrate along a direction from the second surface to the first surface, and the blind via on the base substrate after thinning is performed forms a via hole penetrating the base substrate — S3

FIG. 13

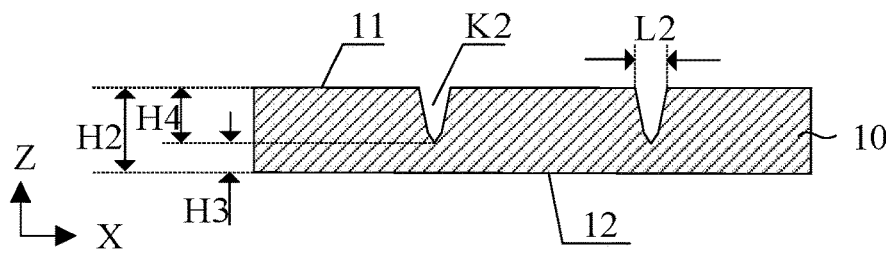

FIG. 14

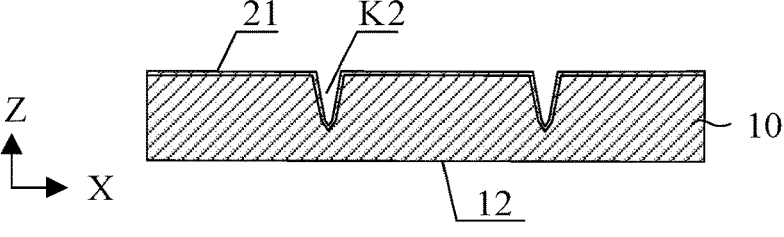

FIG. 15

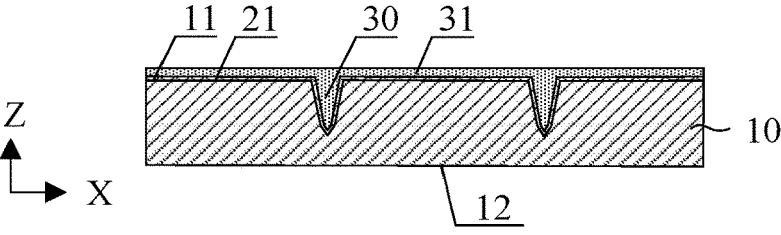

FIG. 16

SUBSTRATE AND PREPARATION METHOD THEREOF, INTEGRATED PASSIVE DEVICE, AND ELECTRONIC APPARATUS

CROSS-REFERENCE TO RELATED APPLICATION

The present application is a U.S. National Phase Entry of International Application No. PCT/CN2022/084563 having an international filing date of Mar. 31, 2022, the content of which is incorporated into this application by reference.

TECHNICAL FIELD

Embodiments of the present disclosure relate to, but are not limited to, the field of semiconductor technology, and in particular to a substrate and a method for preparing the substrate, an integrated passive device, and an electronic apparatus.

BACKGROUND

Many semiconductor devices use metallized via holes to transmit signals, such as a Printed Circuit Board (PCB), an encapsulation carrier board, an adapter board, a Micro-electronic-mechanical-system (MEMS) device, and so on. The substrate material of a metal via hole affects electrical, mechanical, and thermal properties of semiconductor devices. Silicon, polymers, ceramics, and other materials are widely used as the substrate material for preparing metallized via holes in semiconductor devices. In recent years, with the development of glass processing technology, glass has been gradually used as the substrate material for preparing metallized via holes in semiconductor devices. Glass has been widely used in encapsulation components, RF devices and other fields because of its low high-frequency loss, similar thermal expansion coefficient to silicon, and low cost, and the like.

SUMMARY

The following is a summary of subject matters described herein in detail. The summary is not intended to limit the protection scope of claims.

An embodiment of the present disclosure provides a method for preparing a substrate, which includes:

providing a base substrate including at least one blind via, wherein the base substrate includes a first surface and a second surface disposed oppositely, a blind via extends from the first surface to interior of the base substrate, an aperture of the blind via gradually decreases in a direction from the first surface to the second surface;

forming a connection electrode in the blind via; and thinning the base substrate along a direction from the second surface to the first surface, wherein the blind via on the base substrate after thinning is performed forms a via hole penetrating the base substrate.

In an exemplary embodiment, the forming a connection electrode in the blind via includes:

depositing a conductive thin film on the first surface of the base substrate, to enable the conductive thin film to be formed on the first surface and a blind via wall, wherein the conductive thin film serves as a seed layer;

forming an electroplated layer on the conductive thin film; removing a conductive thin film and an electroplated layer located on the first surface, and retaining a seed layer and an electroplated layer located in the blind via, wherein the electroplated layer located in the blind via is the connection electrode.

In an exemplary embodiment, the depositing a conductive thin film on the first surface of the base substrate includes: depositing the conductive thin film on the first surface of the base substrate by adopting a magnetron sputtering process.

In an exemplary embodiment, the removing a conductive thin film and an electroplated layer located on the first surface includes: removing the conductive thin film and the electroplated layer on the first surface of the base substrate by adopting a chemical physical polishing process.

In an exemplary embodiment, the thinning the base substrate along a direction from the second surface to the first surface includes:

bonding a temporary carrier on the first surface of the base substrate, and thinning the base substrate along the direction from the second surface to the first surface; and polishing a thinned side of the base substrate by adopting a chemical physical polishing process.

In an exemplary embodiment, before the bonding a temporary carrier on the first surface of the base substrate, the method further includes: forming a front conductive film layer on a side of the first surface of the base substrate;

the bonding a temporary carrier on the first surface of the base substrate includes: bonding the temporary carrier on the front conductive film layer on the first surface of the base substrate;

after the polishing a thinned side of the base substrate by adopting a chemical physical polishing process, the method further includes: forming a back conductive film layer on a polished surface of the base substrate; and removing the temporary carrier;

the front conductive film layer and the back conductive film layer are electrically connected through the connection electrode.

In an exemplary embodiment, the provided base substrate including at least one blind via has a thickness of 400 microns to 800 microns, a depth of the blind via is 100 microns to 300 microns, a thickness of the thinned base substrate is 100 microns to 300 microns, and an aperture size of the blind via is less than 150 microns.

In an exemplary embodiment, before the providing a base substrate including at least one blind via, the method further includes: forming the at least one blind via on the first surface of the base substrate by laser modification and wet etching.

In an exemplary embodiment, a material of the base substrate is glass.

An embodiment of the present disclosure further provides a substrate including: a base substrate including a first surface and a second surface disposed oppositely; a via hole is provided on the base substrate, and a connection electrode is provided in the via hole; an aperture of the via hole gradually decreases in a direction from the first surface to the second surface.

In an exemplary embodiment, the substrate further includes a front conductive film layer and a back conductive film layer; the front conductive film layer is provided on the first surface, the back conductive film layer is provided on the second surface, and the front conductive film layer and the back conductive film layer are electrically connected through the connection electrode.

In an exemplary embodiment, a minimum aperture size of the via hole is 20 microns to 50 microns, and a maximum aperture size of the via hole is 40 microns to 60 microns.

An embodiment of the present disclosure further provides an integrated passive device, including the substrate of any of the above embodiments.

An embodiment of the present disclosure further provides an electronic apparatus, which includes the integrated passive device according to any one of the above embodiments.

An embodiment of the present disclosure further provides an electronic apparatus, which includes the substrate of any one of the aforementioned embodiments.

Other aspects may be understood upon reading and understanding the drawings and detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of each component in the drawings do not reflect actual scales, and are only intended to schematically illustrate contents of the present disclosure.

FIG. 9 is a schematic diagram of a cross-sectional structure of bonding a second carrier on a first surface of a glass underlaying substrate.

FIG. 10 is a schematic diagram of a cross-sectional structure after an electroplated layer of a second surface is removed.

FIG. 11 is a schematic diagram of a cross-sectional structure after a second carrier and a glass underlaying substrate are unbonded.

FIG. 12 is a schematic diagram of a cross-sectional structure after a first conductive film layer and a second conductive film layer are formed on a first surface and a second surface.

FIG. 13 is a flowchart of a method for preparing a substrate according to an embodiment of the present disclosure.

FIG. 14 is a schematic diagram of a cross-sectional structure after a blind via is formed on a base substrate according to an exemplary embodiment of the present disclosure.

FIG. 15 is a schematic diagram of a cross-sectional structure after a conductive thin film is formed on a first surface of a base substrate according to an exemplary embodiment of the present disclosure.

FIG. 16 is a schematic diagram of a cross-sectional structure after an electroplated layer is formed on a conductive thin film according to an exemplary embodiment of the present disclosure.

DETAILED DESCRIPTION

Figure 1:
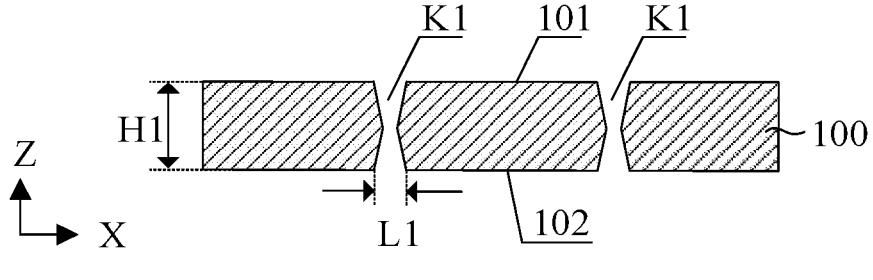
FIG. 1 is a schematic diagram of a cross-sectional structure of a glass underlaying substrate.

The embodiments of the present disclosure will be described in detail below with reference to the drawings. Implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to make following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

Scales of the drawings in the present disclosure may be used as a reference in the actual process, but are not limited thereto. For example, a thickness and a spacing of each film layer, and a width and a spacing of each signal line may be adjusted according to an actual situation. The drawings described in the present disclosure are only schematic diagrams of structures, and one implementation mode of the present disclosure is not limited to shapes or numerical values or the like shown in the drawings.

Ordinal numerals such as "first", "second", and "third" in the specification are set to avoid confusion of constituent elements, but are not set to make a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to a direction which is used for describing each constituent element. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection; it may be a mechanical connection or an electrical connection; it may be a direct mutual connection, or an indirect connection through middleware, or internal communication between two components. Those of ordinary skills in the art may understand specific meanings of these terms in the present disclosure according to specific situations.

In the specification, "electrical connection" includes a case where constituent elements are connected together through an element with a certain electrical effect. The "element with the certain electrical effect" is not particularly limited as long as electrical signals may be sent and received between the connected constituent elements. Examples of the "element with the certain electrical effect" not only include an electrode and a wiring, but also a switch element (such as a transistor), a resistor, an inductor, a capacitor, another element having one or more functions, and the like.

In the specification, "parallel" refers to a state in which an angle formed by two straight lines is −10° or more and 100 or less, and thus may include a state in which the angle is −5° or more and 5° or less. In addition, "perpendicular" refers to a state in which an angle formed by two straight lines is 800 or more and 1000 or less, and thus may include a state in which the angle is 850 or more and 950 or less.

In the specification, a "film" and a "layer" are interchangeable. For example, a "conductive layer" may be replaced with a "conductive film" sometimes. Similarly, an "insulating film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformations caused by tolerance, and there may be chamfer, arc edge and deformation, etc.

In the present disclosure, "about" refers to that a boundary is defined not so strictly and numerical values within process and measurement error ranges are allowed.

In the present disclosure, a "thickness" is a dimension of a film layer in a direction perpendicular to a base substrate.

In semiconductor devices, for underlaying substrates of many different materials used to prepare metal via holes, a via hole fining processing approach usually adopts chemical etching processing, mechanical processing and laser processing, or the like. Via holes are prepared on underlaying substrates of silicon, which are usually processed by a Deep Reactive Ion Etching (DRIE) process that can process via holes with a minimum diameter of about 10 μm and a maximum aspect ratio of 25:1. For underlaying substrates of polymer and ceramic, via holes are usually prepared by machining and laser machining. High-precision drills may be used to prepare via holes with diameters greater than 100 μm in machining, and via holes with diameters greater than 30 μm may be prepared in laser machining. For underlaying substrates of glass, via holes with diameters greater than 10 μm may be prepared by a combining process of laser modification and wet etching. By comparison, it is not difficult to find that among the underlaying substrates of various materials, the via holes prepared by underlaying substrates of glass may be finer.

In the process of preparing via holes on an underlaying substrate of glass, a Through Glass Via (TGV) may be prepared on a surface of the underlaying substrate, and a surface film layer may be prepared after the via is filled with metal.

A preparation process of forming a via hole on an underlaying substrate, filling a metal in the via hole, and forming a surface film layer on a surface of the underlaying substrate is described below. A "patterning process" mentioned in the present disclosure includes coating with a photoresist, mask exposure, development, etching, photoresist stripping, and other treatments for a metal material, an inorganic material, or a light-transmissive conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching. The present disclosure is not limited thereto. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is coincided with the boundary of the orthographic projection of B.

In an exemplary embodiment, the process of preparing a through via, filling a metal layer, and preparing a film layer on a glass underlaying substrate may include the following acts.

(01) Forming a pattern of a first through via penetrating the glass underlaying substrate.

In an exemplary embodiment, forming a pattern of a first through via penetrating the glass underlaying substrate may include: at least one first through via penetrating the glass underlaying substrate is formed on the glass underlaying substrate to obtain the pattern of the through via penetrating the glass underlaying substrate. In an exemplary embodiment, as shown in FIG. 1, the glass underlaying substrate 100 may include a first surface 101 and a second surface 102 disposed oppositely, and the first through via K1 penetrates the first surface 101 and the second surface 102 of the glass underlaying substrate 100.

In an exemplary embodiment, at least one first through via penetrating the glass underlaying substrate is formed on the glass underlaying substrate, which may include: forming at least one first through via K1 by laser modification and wet etching.

In an exemplary embodiment, forming the at least one first through via K1 by laser modification and wet etching may include acts A11 to A12.

In act A11, a first counter hole is obtained on the first surface 101 of the glass underlaying substrate 100 by laser modification and wet etching;

In act A12, a second counter hole is obtained on the second surface 102 of the glass underlaying substrate 100 by laser modification and wet etching; and the second counter hole is combined with the first counter hole to form a first through via K1.

In the above acts A11 to A12, surfaces of walls of the first counter hole and the second counter hole formed by laser modification is uneven, have multiple molten burrs, and a large number of micro-cracks and macro-cracks, and there are residual stresses. By wet etching, a surface region of the sidewall of the laser through via is smooth and flat, without micro-cracks and macro-cracks, and the stress zone can be completely etched away.

In the exemplary embodiment, by an etching mode in which the first counter hole is formed on the first surface 101 and the second counter hole is formed on the second surface 102, an etching error can be avoided to a large extent in a case where the glass underlaying substrate 100 is thicker, and the accuracy of the first through via K1 can be improved.

In another exemplary embodiment, forming the at least one first through via K1 by laser modification and wet etching may include acts A21 to A22:

In act A21, a laser through via is formed on the first surface 101 of the glass underlaying substrate 100 by laser modification.

In act A22, a surface of the laser through via is etched by wet etching to obtain a first through via K1.

In the embodiment of the present disclosure, because a surface of a sidewall of the laser through via formed by laser modification is uneven, has multiple molten burrs, and a large number of micro-cracks and macro-cracks, and there are residual stresses, a surface region of the sidewall of the laser through via is smooth and flat by wet etching, without micro-cracks and macro-cracks, and the stress zone can be etched away.

In an exemplary embodiment, the above wet etching may use 2%-20% HF etching solution, and at an appropriate temperature for a certain time, may etch off the glass in the stress zone, so that the inside and surface of the first through via K1 near the via are smooth and flat, without micro-cracks or macro-cracks, and the stress zone can be etched away.

In an exemplary embodiment, the thickness H1 of the glass underlaying substrate 100 (i.e., a size of the glass underlaying substrate 100 in a third direction Z in FIG. 1) may be from 100 microns to 300 microns.

In an exemplary embodiment, the aperture L1 of the first through via K1 (i.e., a size of the first through via K1 in a first direction X in FIG. 1) may be less than 150 microns, for example, the aperture L1 of the first through via K1 may be less than 100 microns.

In an exemplary embodiment, the first through via K1 may be an hourglass shape.

In an exemplary embodiment, the at least one first through via K1 is not limited to being formed by laser modification and wet etching, for example, the at least one first through via K1 may be formed by mechanical, chemical etching.

(02) Forming a pattern of a first seed layer.

Figure 2:
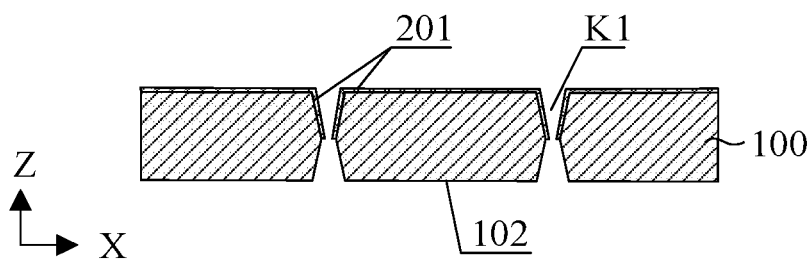
FIG. 2 is a schematic diagram of a cross-sectional structure after a first conductive thin film is formed on a first surface of a glass underlaying substrate and on a sidewall of a first through via K1.

In an exemplary embodiment, as shown in FIG. 2, forming the pattern of the first seed layer may include: a first conductive thin film 201 is deposited by magnetron sputtering on the first surface 101 of the glass underlaying substrate 100 on which the pattern of the first through via K1 is formed, so that the first conductive thin film 201 is formed on the first surface 101 of the glass underlaying substrate 100 and on sidewalls of sides of multiple first through vias K1 facing the first surface 101. The pattern of the first seed layer may include the first conductive thin film 201, which may serve as the first seed layer.

In the embodiment of the present disclosure, since the first through via K1 is of an hourglass shape, in the process of forming the pattern of the first seed layer, the sidewall of a side of the first through via K1 facing the second surface 102 of the glass underlaying substrate 100 is shielded by the waist of the first through via K1, and the first conductive thin film 201 cannot be deposited.

(03) Forming a pattern of a second seed layer.

Figure 3:
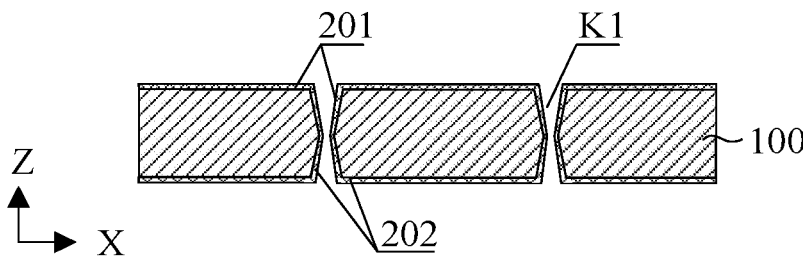
FIG. 3 is a schematic diagram of a cross-sectional structure after a second conductive thin film is formed on a second surface of a glass underlaying substrate and on a sidewall of a first through via K1.

In an exemplary embodiment, as shown in FIG. 3, forming the pattern of the second seed layer may include: a second conductive thin film 202 is deposited by magnetron sputtering on the second surface 102 side of the glass underlaying substrate 100 on which the pattern of the first seed layer is formed, so that the second conductive thin film 202 is formed on the second surface 102 of the glass underlaying substrate 100 and on sidewalls of sides of the multiple first through vias K1 facing the second surface 102. The pattern of the second seed layer may include the second conductive thin film 202, which may serve as the second seed layer.

In the embodiment of the present disclosure, since the first through via K1 is of an hourglass shape, in the process of forming the pattern of the second seed layer, the sidewall of a side of the first through via K1 facing the first surface 101 of the glass underlaying substrate 100 is shielded by the waist of the first through via K1, and the first conductive thin film 202 cannot be deposited. By forming the first seed layer on the first surface 101 side and the second seed layer on the second surface 102 side, the seed layer may be formed at the waist of the first through via K1 of the hourglass shape. That is, the first seed layer and the second seed layer can be continuous at the waist of the first through via K1, and the first seed layer and the second seed layer may be made of the same material, for example, the first seed layer and the second seed layer may be made of a metal material such as silver Ag, copper Cu, aluminum Al, molybdenum Mo and the like.

(04) Forming a pattern of an electroplated layer.

Figure 4:
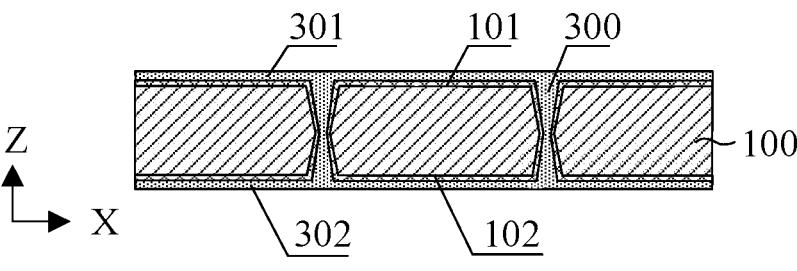
FIG. 4 is a schematic diagram of a cross-sectional structure after a first electroplated layer is formed.

In an exemplary embodiment, as shown in FIG. 4, forming a pattern of an electroplated layer may include: on the glass underlaying substrate 100 on which the aforementioned patterns are formed, through double-sided electroplating process, a first connection electrode 300 is formed in multiple first through vias K1 of the glass underlaying substrate 100 using the first seed layers and the second seed layers on the sidewalls of the first through vias K1, a first electroplated layer 301 is formed on the first conductive thin film 201 of the first surface 101, and a second electroplated layer 302 is formed on the second conductive thin film 202 of the second surface 102, to form the pattern of the electroplated layer. That is, the pattern of the electroplated layer includes the first connection electrode 300, the first electroplated layer 301, and the second electroplated layer 302. The first electroplated layer 301, the second electroplated layer 302, and the first connection electrode 300 may be an integrally formed structure.

Figure 5:
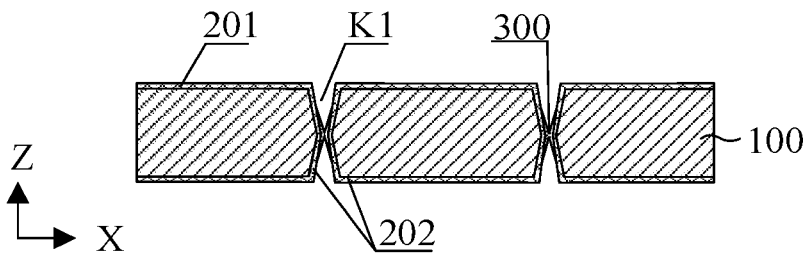
FIG. 5 is a schematic diagram of a structure of a process of forming a first electroplated layer.

In an embodiment of the present disclosure, in order to fill the electroplated layer without porosity in the first through via K1, a double-sided electroplating process is used, and current is applied simultaneously on the first surface 101 side and the second surface 102 side. As shown in FIG. 5, the electroplating process may be a bridge deck or a butterfly-shaped filling mode combining the shape of the first through via K1 with the double-sided electroplating process. The first through via K1 is first filled in the waist, and then the electroplated layer is filled towards the first surface 101 and the second surface 102 respectively.

In an exemplary embodiment, a material of the first connection electrode 300, the first electroplated layer 301, and the second electroplated layer 302 may be a metal, for example, copper.

(05) Removing the first electroplated layer on the first surface.

Figure 6:
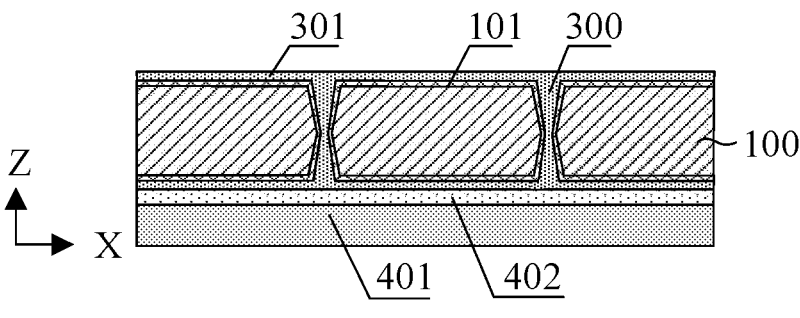
FIG. 6 is a schematic diagram of a cross-sectional structure of bonding a first carrier on a second surface side of a glass underlaying substrate.
Figure 7:
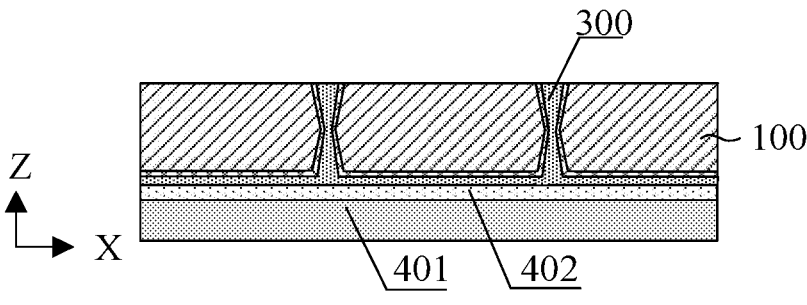
FIG. 7 is a schematic diagram of a cross-sectional structure after an electroplated layer and a conductive thin film on the first surface are removed.
Figure 8:
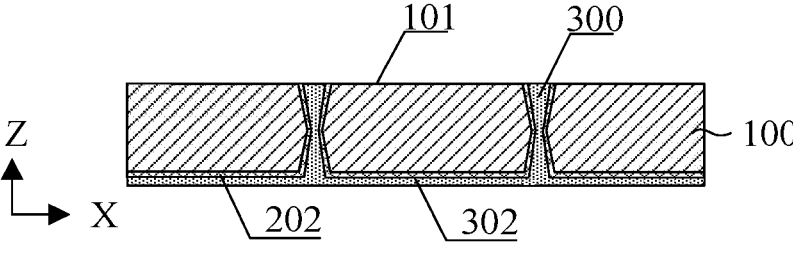
FIG. 8 is a schematic diagram of a cross-sectional structure after a first carrier and a glass underlaying substrate are unbonded.

In an exemplary embodiment, as shown in FIGS. 6 to 8, removing the first electroplated layer on the first surface may include: a first carrier 401 is temporarily bonded on the second surface 302 of the glass underlaying substrate 100 on which the aforementioned patterns are formed, and the first carrier 401 may be bonded with the second surface 302 of the glass underlaying substrate 100 through a first bonding adhesive layer 402, as shown in FIG. 6. Then, the first electroplated layer 301 and the first conductive thin film 201 located on the first surface 101 are removed, and the first electroplated layer 301 may be removed by a Chemical physical Polishing (CMP) process, as shown in FIG. 7. The first carrier 401 is unbonded from the glass underlaying substrate 100 as shown in FIG. 8.

In the embodiment of the present disclosure, in the case where the thickness of the glass underlaying substrate 100 is relatively small, by bonding the glass underlaying substrate 100 with the first carrier 401, the strength can be increased, and the glass underlaying substrate 100 can be prevented from cracking or damage in the process of removing the first electroplated layer 301.

(06) Removing the second electroplated layer on the first surface.

In an exemplary embodiment, as shown in FIGS. 9 to 11, removing the second electroplated layer may include: the glass underlaying substrate 100 on which the first electroplated layer 301 is removed is turned over, and then a second carrier 501 is temporarily bonded on the first surface 301 of the glass underlaying substrate 100, the second carrier 501 may be bonded to the first surface 301 of the glass underlaying substrate 100 by a second bonding adhesive layer 502, as shown in FIG. 9. Then, the second electroplated layer 302 on the second surface 102 is removed, and the second electroplated layer 302 may be removed by a Chemical physical Polishing (CMP) process, as shown in FIG. 10. The second carrier 501 is unbonded from the glass underlaying substrate 100, as shown in FIG. 11.

In the embodiment of the present disclosure, in the case where the thickness of the glass underlaying substrate 100 is relatively small, by bonding the glass underlaying substrate 100 with the second carrier 501, the strength can be increased, and the glass underlaying substrate 100 can be prevented from cracking or damage in the process of removing the second electroplated layer 302.

(07) Preparing a conductive film layer.

In an exemplary embodiment, as shown in FIG. 12, preparing a conductive film layer may include: a first conductive film layer 601 is prepared on the first surface 101 of the glass underlaying substrate 100 from which the first electroplated layer 301 and the second electroplated layer 302 are removed, and a second conductive film layer 602 is prepared on the second surface 102, and the first conductive film layer 601 and the second conductive film layer 602 may be electrically connected through the first connection electrode 300 in the first through via K1.

As can be seen from the above process acts (01) to (07), there are the following defects.

(1) The thickness of the glass underlaying substrate 100 is usually in a range of about 100 microns to about 300 microns, because the thickness of the glass underlaying substrate 100 is small, it is easy to cause the glass underlaying substrate 100 to break in the process of preparing the first through via K1, transporting the glass underlaying substrate 100, removing the first electroplated layer 301 and removing the second electroplated layer 302, and the risk of breaking of the glass underlaying substrate 100 is relatively high.

(2) Since the prepared first through via K1 is an hourglass-shaped through via, an aperture size of the middle waist portion is smaller than the through via sizes adjacent to the first surface 101 and the second surface 102, in the process of preparing the seed layer on one of the surfaces, the seed layer cannot be formed on the sidewall near the other surface at the waist of the first through via K1, and it is necessary to prepare the seed layer twice, i.e., on the first surface 101 side and the second surface 102 side respectively, therefore the process is complicated and the preparation cost is high.

(3) Because the first through via K1 is a through via structure, in the process of preparing the seed layer by magnetron sputtering, in order to avoid polluting the equipment base during the magnetron sputtering process, it is necessary to place the glass underlaying substrate 100 on a tray that is cleaned regularly, and there is an extra process of cleaning the tray.

(4) In the process of forming the first connection electrode 300 in the first through via K1, a double-sided electroplating process is required, i.e., double-sided electroplating is performed, that is, on the first surface 101 side and the second surface 102 side, which is difficult in the process and low in production efficiency.

(5) The acts of temporarily bonding the carrier, removing the electroplated layer, and removing the carrier need to be performed on the first surface 101 and the second surface 102 of the glass underlaying substrate 100, respectively, i.e., the acts of bonding the carrier twice, removing the electroplated layer twice, and removing the carrier twice need to be performed, so that the operation is complicated and the production efficiency is low.

An embodiment of the present disclosure provides a method for preparing a substrate, which may include: providing a base substrate including at least one blind via, wherein the base substrate includes a first surface and a second surface disposed oppositely, a blind via extends from the first surface to interior of the base substrate, an aperture of the blind via gradually decreases in a direction from the first surface to the second surface; forming a connection electrode in the blind via; and thinning the base substrate along a direction from the second surface to the first surface, wherein the blind via after thinning is performed forms a via hole penetrating the base substrate.

According to the method for preparing the substrate, firstly a connection electrode is formed in a blind via of a base substrate, then, the base substrate is thinned along a direction from a second surface to a first surface, so that the thickness of the substrate is relatively thick in the process of preparing the connection electrode in the blind via. Because the base substrate is relatively thick, the occurrence of base substrate damage due to the thin base substrate in the process of preparing the connection electrode can be reduced to a certain extent, and the risk of breaking of the base substrate is reduced.

In an exemplary embodiment, as shown in FIG. 13, a method for preparing a substrate according to an embodiment of the present disclosure may include the following acts.

In act S1, a base substrate including at least one blind via is provided, the base substrate includes a first surface and a second surface disposed oppositely, a blind via extends from the first surface to interior of the base substrate, and an aperture of the blind via gradually decreases in a direction from the first surface to the second surface; As shown in FIG. 14, 10 denotes the base substrate, 11 denotes the first surface, 12 denotes the second surface, and K2 denotes the blind via.

In act S2, a connection electrode is formed in the blind via.

In act S3, the base substrate is thinned along a direction from the second surface to the first surface, and the blind via on the base substrate after thinning is performed forms a via hole penetrating the base substrate.

In an exemplary embodiment, in act S2, the connection electrode is formed in the blind via, which may include acts S21 to S23:

In act S21, a conductive thin film is deposited on the first surface of the base substrate, to enable the conductive thin film to be formed on the first surface and a blind via wall, and the conductive thin film may serve as a seed layer; as shown in FIG. 15, K2 denotes the blind via, and 21 denotes the conductive thin film which may serve as a seed layer.

In an exemplary embodiment, the shape of the blind via K2 may be a taper.

In act S22, an electroplated layer is formed on the conductive thin film; as shown in FIG. 16, 31 denotes an electroplated layer, which may include a connection electrode 30 located in the blind via K2.

Figure 17:
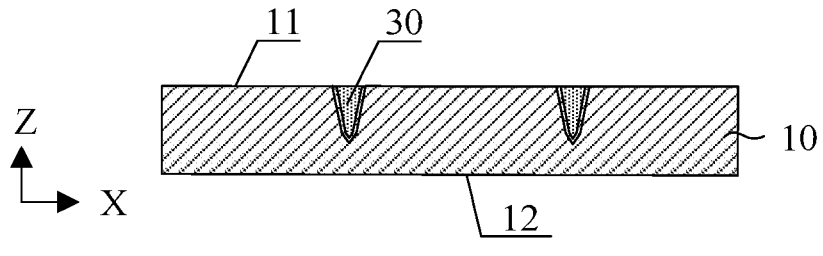
FIG. 17 is a schematic diagram of a cross-sectional structure after a conductive thin film and an electroplated layer on a first surface of a base substrate are removed according to an exemplary embodiment of the present disclosure.

In act S23, a conductive thin film and an electroplated layer located on the first surface are removed, and a seed layer and an electroplated layer located in the blind via are retained, wherein the electroplated layer in the blind via K2 is the connection electrode 30, as shown in FIG. 17.

In an exemplary embodiment, in act S21, the conductive thin film is deposited on the first surface of the base substrate, which may include: the conductive thin film 21 is deposited on the first surface 11 of the base substrate 10 using a magnetron sputtering process.

In an exemplary embodiment, in act S23, the conductive thin film and the electroplated layer located on the first surface are removed, which may include: the conductive thin film 21 and the electroplated layer 31 on the first surface 11 of the base substrate 10 are removed by a chemical physical polishing process.

In an exemplary embodiment, in act S3, the base substrate is thinned in a direction from the second surface to the first surface, which may include the following acts S31 to S32.

Figure 20:
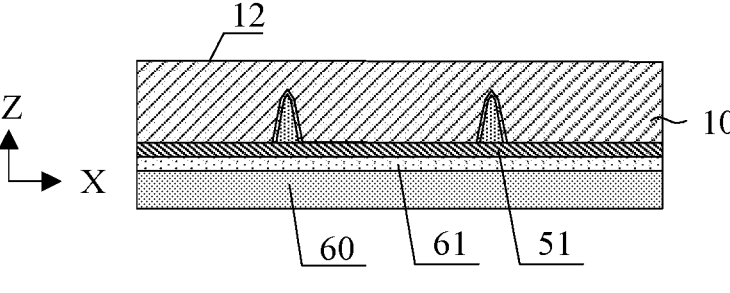
FIG. 20 is a schematic diagram of a cross-sectional structure of bonding a carrier on a front conductive film layer of a base substrate according to an embodiment of the present disclosure.
Figure 21:
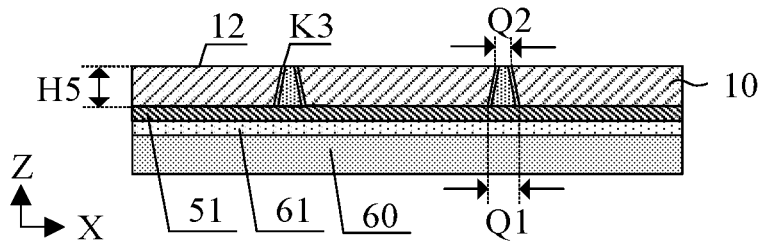
FIG. 21 is a schematic diagram of a cross-sectional structure after a base substrate is thinned along a direction from a first surface to a second surface according to an embodiment of the present disclosure.

In act S31, a temporary carrier is bonded on the first surface 11 of the base substrate 10, and the base substrate 10 is thinned along the direction from the second surface 12 to the first surface 10; and as shown in FIGS. 20 and 21, 60 denotes a temporary carrier, and the temporary carrier 60 is bonded to the base substrate 10 through a bonding adhesive 61.

In act S32, a thinned side of the base substrate 10 is polished by adopting a chemical physical polishing process.

Figure 19:
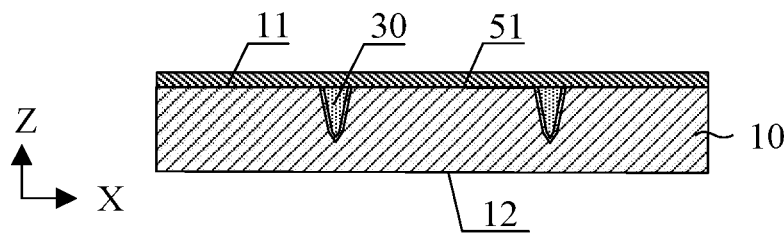
FIG. 19 is a schematic diagram of a cross-sectional structure after a front conductive film layer is formed on a first surface of a base substrate according to an embodiment of the present disclosure.

In an exemplary embodiment, before the temporary carrier is bonded on the first surface 11 of the base substrate 10 in act S31, the method may further include a front conductive film layer is formed on the first surface 11 of the base substrate 10; as shown in FIG. 19, 51 denotes the front conductive film layer.

Accordingly, the temporary carrier is bonded on the first surface 11 of the base substrate 10, which may include: the temporary carrier 60 is bonded on the front conductive film layer 51 on the first surface 11 of the base substrate 10.

Figure 22:
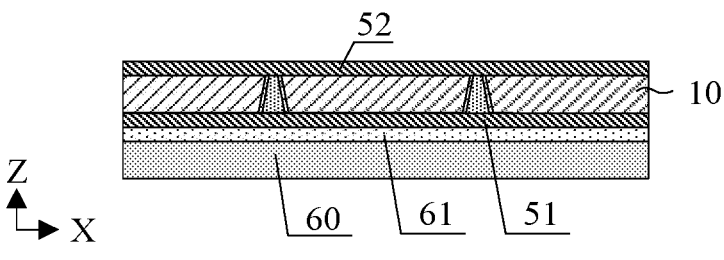
FIG. 22 is a schematic diagram of a cross-sectional structure after a back conductive film layer is formed on a thinned side of a base substrate according to an embodiment of the present disclosure.

After act S32, the method may further include: a back conductive film layer is formed on a polished surface of the base substrate 10; and the temporary carrier 60 is removed; as shown in FIG. 22, 52 denotes the back conductive film layer.

As shown in FIG. 22, the front conductive film layer 51 and the back conductive film layer 52 may be electrically connected through the connection electrode 30.

In an exemplary embodiment, the temporary carrier 60 may be made of a material such as glass or silicon.

In an exemplary embodiment, as shown in FIG. 14, a thickness H2 of the provided base substrate including at least one blind via K2 ranges from 400 microns to 800 microns, and a depth H4 of the blind via K2 ranges from 100 microns to 300 microns.

In an exemplary embodiment, as shown in FIG. 21, a thickness H5 of the thinned substrate may be from 100 microns to 300 microns. In an exemplary embodiment, the aperture size of the blind via K2 may be less than 150 microns, for example, as shown in FIG. 21, the aperture size Q1 (L2 in FIG. 14) of the blind via K2 or the via hole K3 may be less than 150 microns.

In an exemplary embodiment, before the base substrate 10 including at least one blind via K2 is provided in act S1, the method further comprises: on the first surface 11 of the base substrate 10, the at least one blind via is formed by laser modification and wet etching.

In an exemplary embodiment, a material of the base substrate 10 may be glass.

In an exemplary embodiment, a detailed process of preparing the substrate may include acts (11) to act (18).

(11) Forming a pattern of a blind via on a base substrate.

In an exemplary embodiment, as shown in FIG. 14, forming the pattern of the blind via on the base substrate may include: at least one blind via K2 is formed on the first surface 11 of the base substrate 10 to obtain the pattern of the blind via K2. In an exemplary embodiment, as shown in FIG. 14, the base substrate 10 may include a first surface 11 and a second surface 12 disposed oppositely, and the blind via K2 extends from the first surface 11 of the base substrate 100 to the interior of the base substrate 10.

In an exemplary embodiment, at least one blind via K2 is formed on the first surface 11 side of the base substrate 10, which may include: at least one blind via K2 is formed by laser modification and wet etching.

In an exemplary embodiment, at least one blind via K2 is formed by laser modification and wet etching, which may include acts C1 and C2:

In act C1, a laser blind via or a modified zone is formed by laser modification on the first surface 11 of the base substrate 10.

In act C2, a surface of the laser blind via is etched by wet etching or the modified zone is etched, to obtain the blind via K2.

In the embodiment of the present disclosure, because a surface of a sidewall of the laser blind via formed by laser modification is uneven, has multiple molten burrs, and a large number of micro-cracks and macro-cracks, and there are residual stresses, a surface region of the sidewall of the laser through via is smooth and flat by wet etching, without micro-cracks and macro-cracks, and the stress zone can be completely etched away.

In an exemplary embodiment, the above wet etching may use 2%-20% HF etching solution, and at an appropriate temperature for a certain time, may etch off the glass in the stress zone, so that the inside and surface of the blind via K2 near the via are smooth and flat, without micro-cracks or macro-cracks, and the stress zone can be etched away.

In an exemplary embodiment, the thickness H2 of the base substrate 10 (i.e., a size of the base substrate 10 in the third direction Z in FIG. 14) may be 400 microns to 800 microns, for example, the thickness H2 of the base substrate 10 may be 500 microns or 700 microns.

In an exemplary embodiment, the aperture L2 of the blind via K2 (i.e., the aperture size of the blind via K2 in the first direction X in FIG. 14) may be less than 150 microns, for example, the aperture L2 of the blind via K2 may be less than 100 microns.

In an exemplary embodiment, the aperture of the blind via K2 gradually decreases in the direction from the first surface 11 to the second surface 12.

In an exemplary embodiment, the at least one blind via K2 is not limited to being formed by laser modification and wet etching, for example, the at least one blind via K2 may be formed by mechanical chemical etching.

In an embodiment of the present disclosure, after the blind via K2 is formed in the base substrate 10, a reserved thickness H3 is provided on the second surface 12 side to reserve space for subsequent thinning. In an exemplary embodiment, the reserved thickness H3 may be several microns to tens of microns.

In an exemplary embodiment, the depth H4 of the blind via K2 may be from 100 microns to 300 microns, i.e., the sum of the depth H4 of the blind via K2 and the reserved thickness H3 is the thickness H2 of the base substrate 10.

In the embodiment of the present disclosure, the base substrate 10 is provided with a reserved thickness H3, so that the thickness of the base substrate 10 is relatively thick and the mechanical strength is relatively large, and the risk of breaking of the base substrate 10 can be reduced to a certain extent.

In the exemplary embodiment, the aperture size of the blind via K2 gradually decreases in a thickness direction of the base substrate 10, that is, the aperture size of the blind via K2 gradually decreases in an opposite direction of the third direction Z in FIG. 14, and there will be no shielding in a subsequent process of forming a conductive layer thin film.

(12) Forming a conductive thin film.

In an exemplary embodiment, as shown in FIG. 15, forming the conductive thin film may include: a conductive thin film 21 is deposited in a magnetron sputtering manner on the first surface 11 of the base substrate 10 on which the pattern of the blind via K2 is formed, so that the conductive thin film 21 is formed on the first surface 11 of the base substrate 10 and multiple blind via K2 walls. The conductive thin film 21 may serve as a seed layer. In the embodiment of the present disclosure, the seed layer only needs to be prepared on the first surface 11 of the base substrate 10, and does not need to be prepared on both sides of the base substrate 10, thus simplifying the process and reducing the preparation cost. Moreover, the aperture of the blind via K2 gradually decreases in the direction from the first surface 11 to the second surface 12, thus there is no shielding during the magnetron sputtering process of forming the conductive thin film 21.

(13) Forming an electroplated layer.

In an exemplary embodiment, as shown in FIG. 16, forming the electroplated layer may include: on the base substrate 10 on which the conductive thin film 21 is formed, by an electroplating process, a second connection electrode 30 is formed in multiple blind vias K2 of the base substrate 10 using the conductive thin film 21 on the walls of the blind vias K2, and a third electroplated layer 31 is formed on the conductive thin film 21 on the first surface 11, that is, the electroplated layer may include the second connection electrode 30 and the third electroplated layer 31, and the third electroplated layer 31 and the second connection electrode 30 may have an integrally formed structure.

In the embodiment of the present disclosure, since the blind via K2 is not a through via, and the aperture of the blind via K2 gradually decreases along the direction from the first surface 11 to the second surface 12, there is no shielding in the electroplating process, and an electroplated layer is formed by adopting a single-side electroplating manner, thus greatly reducing the process difficulty and improving the production efficiency.

In an exemplary embodiment, the material of the second connection electrode 30 and the third electroplated layer 31 may be a metal, for example, copper. In the embodiment of the present disclosure, the second connection electrode 30 is the connection electrode 30 described above, and the third electroplated layer 31 is the electroplated layer 31 described above.

(14) Removing the third electroplated layer and the conductive thin film on the first surface.

In an exemplary embodiment, removing the third electroplated layer 31 and the conductive thin film 21 may include: the third electroplated layer 31 and the conductive layer thin film 21 on the first surface 11 may be removed by a Chemical physical Polishing (CMP) process, as shown in FIG. 17.

Figure 18:
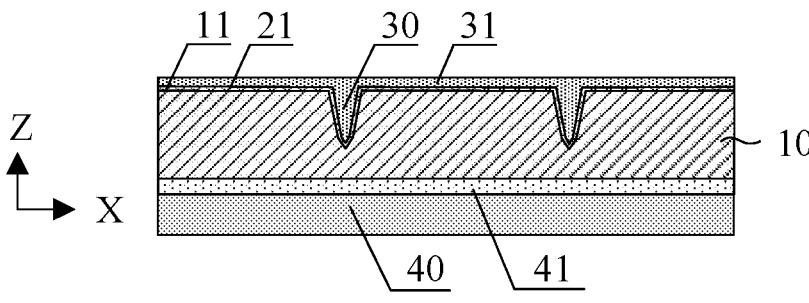
FIG. 18 is a schematic diagram of a cross-sectional structure of bonding a carrier on a second surface of a base substrate according to an embodiment of the present disclosure.

In an exemplary embodiment, as shown in FIG. 18, before the removal of the third electroplated layer, the process may further include: a third carrier 40 is temporarily bonded to the second surface 12 of the base substrate 10 on which the third electroplated layer 31 is formed, and the bonding of the third carrier 40 to the second surface 12 of the base substrate

10 may be performed by a third bonding adhesive layer 41, as shown in FIG. 18. After the third electroplated layer 31 is removed, the process may further include: the third carrier 40 and the base substrate 10 are unbonded, and the view after unbonding is performed is shown in FIG. 17. In the embodiment of the present disclosure, when the thickness of the base substrate 10 is relatively small, bonding the third carrier 40 on the second surface 12 of the base substrate 10 before the third electroplated layer 31 is removed can increase the strength of the base substrate 10, and avoid cracking or damage of the base substrate 10 in the process of removing the third electroplated layer 31. The thickness of the base substrate 10 is relatively small, and a thinner substrate can be prepared.

(15) Forming a front conductive film layer on the first surface.

In an exemplary embodiment, as shown in FIG. 19, the front conductive film layer 51 is formed on the first surface 11. In an embodiment of the present disclosure, the front conductive film layer 51 may be electrically connected to the second connection electrode 30.

(16) Forming a pattern of a via hole.

In an exemplary embodiment, forming the pattern of the via hole may include: a fourth carrier 60 is temporarily bonded on a side of that on which the aforementioned front conductive film layer 51 is formed away from the first surface 11, and the fourth carrier 60 may be bonded to the base substrate 10 by a fourth bonding adhesive layer 61, as shown in FIG. 20. The base substrate 10 is then thinned in a direction from the second surface 12 to the first surface 11 using a thinning process. Then, the thinned side of the base substrate 10 is polished by a Chemical physical Polishing (CMP) process, so that the thickness H5 of the base substrate 10 after thinning and polishing are performed is 100 microns to 300 microns, as shown in FIG. 21. The size of the fifth thickness H5 is smaller than the size of the depth H4 of the blind via K2. The thickness of the part thinned off the base substrate 10 is greater than the reserved thickness H3, e.g. the thickness of the part thinned off the base substrate 10 may be several microns, such that a pattern of a via hole is formed at the position of the blind via K2, and the pattern of the via hole may include at least one via hole K3, as shown in FIG. 21, the via hole K3 is filled with the seed layer 21 and the second connection electrode 30. The via hole K3 penetrates through the thinned base substrate 10.

In an exemplary embodiment, the via hole K3 has an aperture size Q1 (i.e., the maximum aperture size) of 20 microns to 50 microns on the first surface 11, and the third through via K3 has an aperture size Q2 (i.e., the minimum aperture size) of 40 microns to 60 microns on the second surface 12.

(17) Forming a back conductive film layer on a side of the base substrate away from the first surface.

As shown in FIG. 22, the back conductive film layer 52 is formed on the side of the base substrate 10 away from the first surface 11, and the front conductive film layer 51 and the back conductive film layer 52 may be electrically connected through the second connection electrode 30, so that the front conductive film layer 51 and the back conductive film layer 52 may achieve the transmission of an electrical signal.

(18) Removing the fourth carrier.

Figure 23:
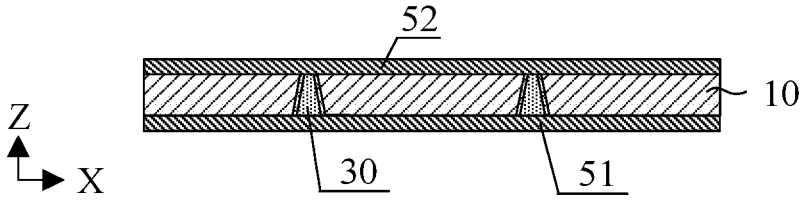
FIG. 23 is a schematic diagram of a cross-sectional structure after a carrier is unbounded from a base substrate according to an embodiment of the present disclosure.

As shown in FIG. 23, the fourth carrier 60 is removed to obtain a substrate including the base substrate 10, the front conductive thin film 51 and the back conductive thin film provided on two sides of the base substrate 10, and the second connection electrode 30 connecting the front conductive thin film 51 and the back conductive thin film 52.

In the embodiment of the present disclosure, the base substrate 10 may be glass, silicon, polymer, ceramic and another material. Glass has been widely used in encapsulation components, RF devices and other fields because of its low high-frequency loss, similar thermal expansion coefficient to silicon and low cost, and the like.

In embodiments of the present disclosure, the glass underlaying substrate formed by the process of acts (01) to (07) may be referred to as a through via process, and the substrate formed by the process of acts (11) to (18) may be referred to as a blind via process. The base substrate 10 may be made of glass. The base substrate 10 has a dimension of 6 Chinese inches or 8 Chinese inches in the first direction X and the second direction Y (the second direction Y is perpendicular to the plane where the first direction X and the third direction Z are located).

Under the condition of preparing through vias and connection electrodes by the blind via process, because the thickness of the base substrate 10 is thinned, devices with a thickness less than 100 microns can be prepared. The through via process is complex, involves many processes, and there is no subsequent thinning process, so the thickness of the prepared devices is usually more than 250 microns. It can be seen that the blind via process can produce finer components than the through via process.

Differences in shape between the through via process and the blind via process are as shown in Table 1.

TABLE 1

Figure 24A:
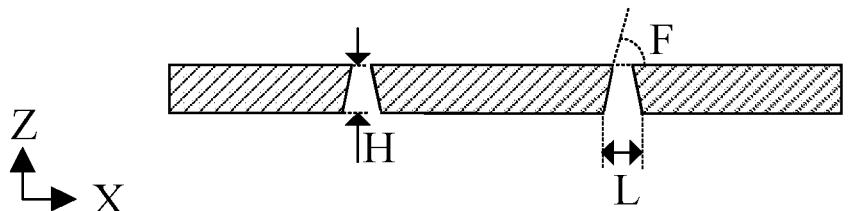
FIG. 24A is a schematic diagram of a morphology of trapezoidal through vias on a base substrate.
Figure 24B:
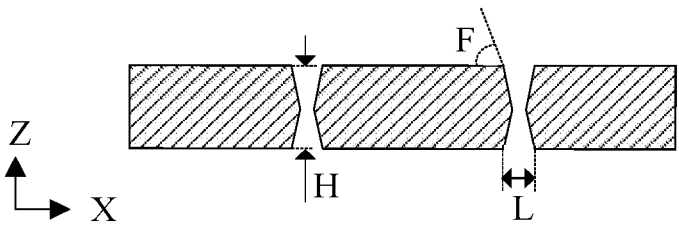
FIG. 24B is a schematic diagram of a morphology of hourglass-shaped through vias on a base substrate.

| | Through via process | Blind via process |
|---|---|---|
| Schematic diagram of morphology | Refer to FIG. 24B | Refer to FIG. 24A |
| Shape | Hourglass | Trapezoid |
| Aperture L | Greater than or equal to 10 microns | Greater than or equal to 10 microns |
| Depth H | Greater than or equal to 250 microns | Less than 250 microns |
| Slope angle F | 82°-84° | 86°-87° |

Because metallized via holes generally play the role of electrical connection, different hole morphologies will affect the device performance. The difference of substrates formed by the blind via process and the through via process increases with the increase of device operating frequency, as shown in Tables 2 and 3, which are the results of High Frequency Structure Simulator (HFSS). Taking three-turn inductor as an example, at 3.5 GHz, the inductance value and impedance value of the hourglass-shaped through via inductor increase with the decrease of the waist aperture, but the quality factor Q value is opposite (that is, the quality factor Q value decreases with the decrease of the waist aperture); the inductance value of a trapezoidal through via inductor device changes with aperture in the same trend as the hourglass-shaped through via, but the change amplitude is smaller than the hourglass inductor. As shown in Table 2 and Table 3, the differences of the performances of the devices using substrates prepared with different shapes through vias are as follows:

TABLE 2

| Performances of Hourglass-Shaped Through Via Devices | | | |
| --- | --- | --- | --- |
| Aperture size of hourglass-shaped through via (micron) L11-L12-L13 | Quality factor Q | Inductance (nH) | Impedance (ohm) |
| 50-50-50 | 67.07 | 1.40 | 0.46 |
| 50-25-50 | 63.88 | 1.53 | 0.53 |
| 50-15-50 | 60.44 | 1.59 | 0.58 |
| 50-8-50 | 55.29 | 1.65 | 0.66 |

TABLE 3

| Performances of Trapezoidal Through Via Devices | | | |
| --- | --- | --- | --- |
| Aperture size of trapezoidal through via (micron) L21-L22 | Quality factor Q | Inductance (nH) | Impedance (ohm) |
| 50-50 | 67.07 | 1.40 | 0.46 |
| 50-40 | 66.91 | 1.45 | 0.48 |
| 50-30 | 65.85 | 1.50 | 0.50 |
| 50-20 | 64.21 | 1.56 | 0.54 |

In Table 2, L11, and L13 are the apertures at two ends of the hourglass-shaped through via, L12 is the aperture at the waist of the hourglass-shaped through via, and L21 and L22 in Table 3 are the apertures at two ends of trapezoidal through via, respectively.

Figure 25A:
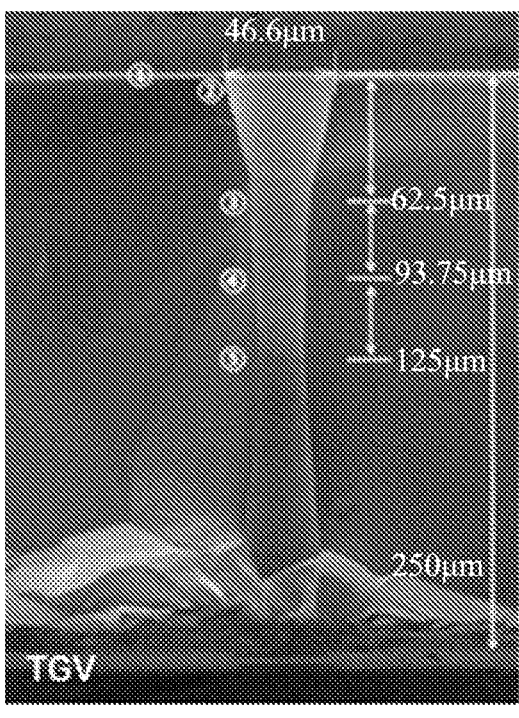
FIG. 25A is an effect diagram of an electrode post formed in a hourglass-shaped through via.
Figure 25B:
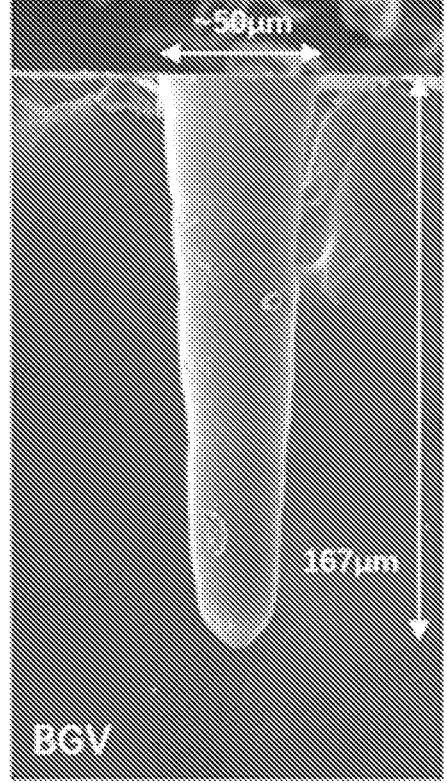
FIG. 25B is an effect diagram of an electrode post formed in a trapezoidal through via.

FIG. 25A shows a test effect diagram obtained after an hourglass-shaped through via is filled with an electrode post. FIG. 25B shows a test effect diagram obtained after a trapezoidal through via is filled with an electrode post, and FIGS. 25A and 25B may be test effect diagrams obtained by a scanning electron microscope (SME).

The blind via process using acts (11) to (18) may also have the following advantages compared to the through via process using acts (01) to (07).

(1) The thickness that the blind via does not pass through may be reserved for preparing the blind via on the base substrate 10, and the total thickness of the base substrate 10 may be in a range of about 400 microns to about 800 microns. Because the thickness of the base substrate 10 is relatively large, in the process of preparing the blind via K2, transporting the base substrate 10 and removing the electroplated layer 31, the base substrate 10 is not easy to break due to the relatively large thickness of the base substrate 10, and the risk of breaking in the base substrate 10 can be reduced.

(2) Because the prepared blind via K2 is trapezoidal, there is no shielding in the process of preparing the seed layer on the first surface 11, and the seed layer only needs to be prepared once, so that the process is relatively simple and the preparation cost is reduced.

(3) Because the blind via K2 is not a through via structure, the equipment base will not be polluted in the process of preparing the seed layer by magnetron sputtering, and the base substrate 10 does not need to be placed on the tray that is cleaned regularly, thus reducing the process of cleaning the tray.

(4). In the process of forming the connection electrode 30 in the blind via K2, a single-side electroplating process is adopted, that is, electroplating is performed on the first surface 11 side, so that the process is less difficult and the production efficiency is high.

(5). It only needs carrier bonding to increase the strength in the process of thinning the base substrate 10, since the base substrate 10 is relatively thick, carrier bonding only needs to be performed once on one surface of the base substrate 10, and the operations of bonding the carrier and removing the carrier are not needed for multiple times, thus, the operation is simple and the production efficiency is high.

An embodiment of the present disclosure further provides a substrate, as shown in FIGS. 14 and 23, which may include a base substrate 10 including a first surface 11 and a second surface 12 disposed oppositely; a via hole is provided on the base substrate 10, and a connection electrode 30 is provided in the via hole; and the aperture of the via hole 30 gradually decreases in the direction from the first surface 11 to the second surface 12.

In an exemplary embodiment, the substrate may further include a front conductive film layer 51 and a back conductive film layer 52; the front conductive film layer 51 is provided on the first surface 11, the back conductive film layer 52 is provided on the second surface 12, and the front conductive film layer 51 and the back conductive film layer 52 are electrically connected through the connection electrode 30. The front conductive film layer 51 may be electrically connected with a component on a side of the first surface 11 of the base substrate 10 away from the second surface 12, and the back conductive film layer 52 may be electrically connected with a component on a side of the second surface 12 of the base substrate 10 away from the first surface 11, and the component may be a passive device such as a capacitor or an inductor.

In an exemplary embodiment, the via hole has an aperture size of 20 microns to 50 microns on the first surface and an aperture size of 40 microns to 60 microns on the second surface. That is, since the aperture size of the via hole gradually decreases in the direction from the first surface to the second surface, and the via hole penetrates the first surface 11 and the second surface 12, the aperture sizes of the same via hole at different positions are different, and the minimum aperture size of the via hole is 20 microns to 50 microns, and the maximum aperture size of the via hole is 40 microns to 60 microns.

An embodiment of the present disclosure further provides an integrated passive device, including the substrate of any of the above embodiments.

In an exemplary embodiment, the passive device of the integrated passive device may be integrated on the first surface and the second surface of the substrate described in any of the above embodiments. In an exemplary embodiment, the passive device integrated on the substrate may enable a communication connection between the devices or a communication connection between a device and an external device through the front conductive film layer, the connection electrode, and the back conductive film layer. In an exemplary embodiment, the passive device may include an inductor, a capacitor, or the like.

An embodiment of the present disclosure further provides an electronic apparatus, which may include the integrated passive device according to any one of the above embodiments.

An embodiment of the present disclosure further provides an electronic apparatus, which may include the substrate of any one of the aforementioned embodiments.

In an embodiment of the present disclosure, the electronic apparatus may be a product or a component with a display function, such as a mobile phone, a computer, a television (TV), a medical monitoring device, a vehicle central control device, a monitor, a laptop computer, a digital photo frame, and a navigator device.

Embodiments of the present disclosure provide a substrate and a preparation method thereof, an integrated passive device, and an electronic apparatus. In the preparation method of the substrate, firstly a connection electrode is formed in a blind via of a base substrate, then, the base substrate is thinned along the direction from the second surface to the first surface, so that the thickness of the base substrate is relatively thick in the process of preparing the connection electrode in the blind via. Because the base substrate is relatively thick, the occurrence of the base substrate damage due to the thin base substrate in the process of preparing the connection electrode can be reduced to a certain extent, and the risk of breaking of the base substrate is reduced.

The drawings of the embodiments of the present disclosure only involve structures involved in the embodiments of the present disclosure, and other structures may refer to usual designs.

The embodiments of the present disclosure, that is, features in the embodiments, may be combined with each other to obtain new embodiments if there is no conflict.

Although the implementations disclosed in the embodiments of the present disclosure are described above, contents are only implementations for facilitating understanding of the embodiments of the present disclosure, which are not intended to limit the embodiments of the present disclosure. Those skilled in the art to which the embodiments of the present disclosure pertain may make any modifications and variations in forms and details of implementations without departing from the spirit and scope disclosed by the embodiments of the present disclosure. Nevertheless, the scope of patent protection of the embodiments of the present disclosure shall still be subject to the scope defined by the appended claims.

The invention claimed is:

1. A method for preparing a substrate, comprising:
providing a base substrate comprising at least one blind via, wherein the base substrate comprises a first surface and a second surface disposed oppositely, a blind via extends from the first surface to interior of the base substrate, an aperture of the blind via gradually decreases in a direction from the first surface to the second surface;
forming a connection electrode in the blind via; and
thinning the base substrate along a direction from the second surface to the first surface, wherein the blind via on the base substrate after thinning is performed forms a via hole penetrating the base substrate;
wherein the thinning the base substrate along a direction from the second surface to the first surface comprises:
bonding a temporary carrier on the first surface of the base substrate, and thinning the base substrate along the direction from the second surface to the first surface; and
polishing a thinned side of the base substrate by adopting a chemical physical polishing process;
wherein before the bonding a temporary carrier on the first surface of the base substrate, the method further comprises: forming a front conductive film layer on the first surface of the base substrate;

the bonding a temporary carrier on the first surface of the base substrate comprises: bonding the temporary carrier on the front conductive film layer on the first surface of the base substrate;
after the polishing a thinned side of the base substrate by adopting a chemical physical polishing process, the method further comprises: forming a back conductive film layer on a polished surface of the base substrate; and removing the temporary carrier;
wherein the front conductive film layer and the back conductive film layer are electrically connected through the connection electrode.

2. The method according to claim 1, wherein the forming a connection electrode in the blind via comprises:
depositing a conductive thin film on the first surface of the base substrate, to enable the conductive thin film to be formed on the first surface and a blind via wall, wherein the conductive thin film serves as a seed layer;
forming an electroplated layer on the conductive thin film;
removing a conductive thin film and an electroplated layer located on the first surface, and retaining a seed layer and an electroplated layer located in the blind via, wherein the electroplated layer located in the blind via is the connection electrode.

3. The method according to claim 2, wherein the depositing a conductive thin film on the first surface of the base substrate comprises: depositing the conductive thin film on the first surface of the base substrate by adopting a magnetron sputtering process.

4. The method according to claim 2, wherein the removing a conductive thin film and an electroplated layer located on the first surface comprises: removing the conductive thin film and the electroplated layer on the first surface of the base substrate by adopting a chemical physical polishing process.

5. The method according to claim 1, wherein the provided base substrate comprising at least one blind via has a thickness of 400 microns to 800 microns, a depth of the blind via is 100 microns to 300 microns, a thickness of the thinned base substrate is 100 microns to 300 microns, and an aperture size of the blind via is less than 150 microns.

6. The method according to claim 1, wherein before the providing a base substrate comprising at least one blind via, the method further comprises:
forming the at least one blind via on the first surface of the base substrate by laser modification and wet etching.

7. The method according to claim 1, wherein a material of the base substrate is glass.

8. A substrate prepared using the method according to claim 1, comprising: the base substrate comprising the first surface and the second surface disposed oppositely; wherein the via hole is provided on the base substrate, and the connection electrode is provided in the via hole.

9. The substrate according to claim 8, wherein a minimum aperture size of the via hole is 20 microns to 50 microns, and a maximum aperture size of the via hole is 40 microns to 60 microns.

10. An integrated passive device, comprising the substrate according to claim 8.

11. An electronic apparatus, comprising the integrated passive device according to claim 10.

* * * * *